(12) United States Patent
Yang et al.

(10) Patent No.: US 11,442,589 B2
(45) Date of Patent: Sep. 13, 2022

(54) TOUCH PANEL AND MANUFACTURING METHOD THEREOF, DISPLAY PANEL AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Jibum Yang, Beijing (CN); Wanli Dong, Beijing (CN)

(73) Assignees: Beijing BOE Technology Development Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 985 days.

(21) Appl. No.: 16/070,035

(22) PCT Filed: Jan. 4, 2018

(86) PCT No.: PCT/CN2018/071076
§ 371 (c)(1),
(2) Date: Jul. 13, 2018

(87) PCT Pub. No.: WO2018/188391
PCT Pub. Date: Oct. 18, 2018

(65) Prior Publication Data
US 2021/0232270 A1    Jul. 29, 2021

(30) Foreign Application Priority Data
Apr. 13, 2017 (CN) .................. 201710240207.X

(51) Int. Cl.
*G06F 3/044* (2006.01)
*G02F 1/1333* (2006.01)
*H01L 27/32* (2006.01)

(52) U.S. Cl.
CPC .......... *G06F 3/0448* (2019.05); *G06F 3/0446* (2019.05); *G02F 1/13338* (2013.01); *G06F 2203/04103* (2013.01); *H01L 27/323* (2013.01)

(58) Field of Classification Search
CPC .............. G06F 3/0448; G06F 3/0446; G06F 2203/04103; H01L 27/323; G02F 1/13338
See application file for complete search history.

(56) References Cited

U.S. PATENT DOCUMENTS

| | | | |
|---|---|---|---|
| 6,727,965 B1 * | 4/2004 | Kubota | G02F 1/133555 349/113 |
| 2002/0118324 A1 * | 8/2002 | Tsuyuki | G02F 1/133553 349/113 |

(Continued)

FOREIGN PATENT DOCUMENTS

| | | |
|---|---|---|
| CN | 1361445 A | 7/2002 |
| CN | 102650917 A | 8/2012 |

(Continued)

OTHER PUBLICATIONS

Search Report and Written Opinion for International Application No. PCT/CN2018/071076 dated Mar. 28, 2017.

(Continued)

*Primary Examiner* — Amy Onyekaba
(74) *Attorney, Agent, or Firm* — Calfee, Halter & Griswold LLP

(57) ABSTRACT

A touch panel and a manufacturing method thereof, a display panel and a display device are described. The touch panel includes a substrate; a touch electrode arranged on the substrate; and a light processing structure arranged on a surface of the touch electrode to scatter light irradiated thereon so as to reduce reflection of light by the surface of the touch electrode. By arranging the light processing structure on the surface of the touch electrode, the touch panel can make light irradiated on the surface of the touch elec- (Continued)

trode to be scattered so as to reduce reflection of light by the surface of the touch electrode. Thus, display brightness of the display panel that uses said touch panel is increased, and the degree of brightness decline is reduced when the display panel that uses said touch panel is used outdoors.

12 Claims, 1 Drawing Sheet

(56) References Cited

U.S. PATENT DOCUMENTS

| | | | | |
|---|---|---|---|---|
| 2012/0105133 A1* | 5/2012 | Kim | G06F 3/0446 | 327/517 |
| 2012/0206395 A1* | 8/2012 | Misaki | G06F 3/0412 | 345/173 |
| 2012/0218198 A1* | 8/2012 | Shin | G02F 1/13338 | 345/173 |
| 2013/0181943 A1* | 7/2013 | Bulea | G06F 3/0448 | 345/174 |
| 2014/0192277 A1* | 7/2014 | Yilmaz | G02B 1/10 | 349/12 |
| 2014/0204284 A1* | 7/2014 | Yao | G02B 5/22 | 349/12 |
| 2014/0327840 A1* | 11/2014 | Kim | G06F 3/0445 | 438/30 |
| 2015/0177878 A1* | 6/2015 | Cheng | G06F 3/0448 | 345/174 |
| 2015/0185903 A1* | 7/2015 | Park | G06F 3/0446 | 345/173 |
| 2015/0220191 A1* | 8/2015 | Huh | G06F 3/0443 | 345/173 |
| 2015/0287381 A1* | 10/2015 | Kim | G06F 3/0418 | 345/82 |
| 2015/0311477 A1* | 10/2015 | Cho | H01L 27/323 | 257/40 |
| 2015/0332965 A1* | 11/2015 | Teramoto | G06F 3/0445 | 345/174 |
| 2015/0370124 A1* | 12/2015 | Han | G02F 1/133514 | 349/12 |
| 2015/0378464 A1* | 12/2015 | Kao | G06F 3/045 | 345/175 |
| 2016/0170524 A1* | 6/2016 | Kim | G06F 3/0446 | 345/174 |
| 2016/0218151 A1* | 7/2016 | Kwon | H01L 27/3276 | |
| 2016/0246404 A1* | 8/2016 | Zhang | G06F 3/041 | |
| 2016/0342245 A1* | 11/2016 | Zhou | G06F 3/0443 | |
| 2016/0342256 A1* | 11/2016 | Zhou | G02F 1/134309 | |
| 2017/0069692 A1* | 3/2017 | Lee | H01L 27/323 | |
| 2017/0090634 A1* | 3/2017 | Yang | G06F 3/0445 | |
| 2017/0115770 A1* | 4/2017 | Han | G06F 3/0446 | |
| 2017/0153753 A1* | 6/2017 | Ishizaki | G06F 3/0445 | |
| 2017/0160592 A1* | 6/2017 | Okuyama | G02F 1/134309 | |
| 2017/0205959 A1* | 7/2017 | Seong | G06F 3/0448 | |
| 2017/0255299 A1* | 9/2017 | Shimoshikiryoh | G02F 1/133345 |
| 2017/0315641 A1* | 11/2017 | Cai | H01L 51/0022 | |
| 2017/0371464 A1* | 12/2017 | Nakanishi | G06F 3/0446 | |
| 2018/0011568 A1* | 1/2018 | Cai | H01L 27/32 | |
| 2018/0019243 A1* | 1/2018 | Kim | H01L 28/90 | |
| 2018/0052552 A1* | 2/2018 | Tsai | G06F 3/0445 | |
| 2018/0107314 A1* | 4/2018 | Wang | G06F 3/0443 | |
| 2018/0136748 A1* | 5/2018 | Li | G06F 3/041 | |
| 2018/0150155 A1* | 5/2018 | Nishikawa | G06F 3/0445 | |
| 2018/0182816 A1* | 6/2018 | Kang | H01L 51/5281 | |
| 2018/0253175 A1* | 9/2018 | Yao | G06F 3/04166 | |
| 2018/0277795 A1* | 9/2018 | Liu | H01L 27/322 | |
| 2019/0339818 A1* | 11/2019 | Rhe | G06F 3/0448 | |
| 2019/0346951 A1* | 11/2019 | Noma | G06F 3/0446 | |

FOREIGN PATENT DOCUMENTS

| | | | |
|---|---|---|---|
| CN | 104820533 A | * | 8/2015 |
| CN | 104881185 A | | 9/2015 |
| CN | 105589243 A | | 5/2016 |
| CN | 106484203 A | * | 3/2017 |
| CN | 106990871 A | | 7/2017 |
| TW | 201533638 A | * | 9/2015 |
| WO | 2013140631 A1 | | 9/2013 |

OTHER PUBLICATIONS

First Office Action for Chinese Patent Application No. 201710240207.X dated Mar. 8, 2019.

* cited by examiner

TOUCH PANEL AND MANUFACTURING METHOD THEREOF, DISPLAY PANEL AND DISPLAY DEVICE

RELATED APPLICATION

The present application is the U.S. national phase entry of PCT/CN2018/071076, with an international filing date of Jan. 4, 2018, which claims the benefit of Chinese Patent Application No. 201710240207.X, filed on Apr. 13, 2017, the entire disclosures of which are incorporated herein by reference.

TECHNICAL FIELD

The present disclosure relates to the field of display technology, in particular to a touch panel and manufacturing method thereof, a display panel and a display device.

BACKGROUND

In recent years, there has been a development of displays from the past Cathode Ray Tube (CRT) display and Liquid Crystal Display (LCD) to the Organic Light-Emitting Diode (OLED) display. The OLED display can realize flexible display. By providing a touch panel on the OLED display panel, touch display can be realized on the OLED display panel.

However, the touch electrode in the touch panel arranged on the OLED display panel usually uses a metal mesh, so light irradiated on the surface of the touch electrode from the external environment will be reflected, which will typically cause the light reflectivity at the light emergent side of the touch panel to increase by over 7%, thus the OLED display panel will have a significant brightness decline when being used outdoors.

SUMMARY

In order to solve one or more of the problems in the prior art, the present disclosure provides a touch panel and a manufacturing method thereof, a display panel and a display device. The touch panel can scatter light irradiated on the surface of the touch electrode so as to reduce reflection of light by the surface of the touch electrode, thereby increasing display brightness of the display panel that uses such touch panel, and reducing the degree of brightness decline when the display panel that uses such touch panel is used outdoors.

According to an embodiment of the present disclosure, a touch panel is provided, which comprises a substrate; a touch electrode arranged on the substrate; and a light processing structure arranged on a surface of the touch electrode to scatter light irradiated thereon so as to reduce reflection of light by the surface of the touch electrode.

In certain exemplary embodiments, the light processing structure comprises a plurality of protrusions. As an example, the plurality of protrusions can be evenly distributed on the surface of the touch electrode.

In certain exemplary embodiments, an interval between any two adjacent ones of the protrusions is within the range of 1 nm~1 μm. Said interval can be a minimum distance between projections of said two adjacent protrusions on the touch electrode.

In certain exemplary embodiments, a cross-section of each protrusion perpendicular to the surface of the touch electrode has a shape of a triangle, a rectangle, a trapezoid, a semicircle, a half ellipse or a regular or irregular polygon.

In certain exemplary embodiments, the material for the protrusion includes indium tin oxide, metal material or carbon.

In certain exemplary embodiments, the surface of the touch electrode includes a surface at a side of the touch electrode facing away from the substrate; or the surface of the touch electrode includes a surface at a side of the touch electrode facing away from the substrate and a surface at a side close to the substrate.

In certain exemplary embodiments, the touch electrodes are distributed in a grid shape. The material for the touch electrode may include metal material. The material for the light processing structure can be the same as the material for the touch electrode.

According to another embodiment of the present disclosure, a display panel is provided, which may comprise the above-described touch panel.

In certain exemplary embodiments, the display panel is an organic electroluminescent panel or a liquid crystal panel.

According to still another embodiment of the present disclosure, a display device is provided, which comprises the above display panel.

According to yet another embodiment of the present disclosure, a manufacturing method for a touch panel is provided, which comprises: forming a touch electrode on a substrate; forming a light processing structure on a surface of the touch electrode, which scatters light irradiated thereon so as to reduce reflection of light by the surface of the touch electrode.

In certain exemplary embodiments, said forming a light processing structure on a surface of the touch electrode comprises:

forming the touch electrode by a patterning process, and etching the surface of the touch electrode during etching in the patterning process so as to form the light processing structure on the surface of the touch electrode; or forming a film layer having the light processing structure through a printing method first, then stamping the film layer having the light processing structure on the surface of the touch electrode.

By using the above-described touch panel in the display panel and display device as provided in the present disclosure, display brightness of the display panel and display device is increased, especially the display brightness of the display panel and display device when being used outdoors is increased, thus the display effects of the display panel and display device are improved.

DETAILED DESCRIPTION

Reference Signs Used Herein are:

1. substrate; 2. touch electrode; 3. light processing structure; 31 protrusion; 4. a side of the touch electrode facing away from the substrate; 5. a side of the touch electrode close to the substrate.

To facilitate those skilled in the art to better understand the technical solution of the present disclosure, the touch panel and manufacturing method thereof, display panel and display device provided in the present disclosure will be described in further detail below in conjunction with the accompanying drawings and the specific embodiments.

Figure 1:
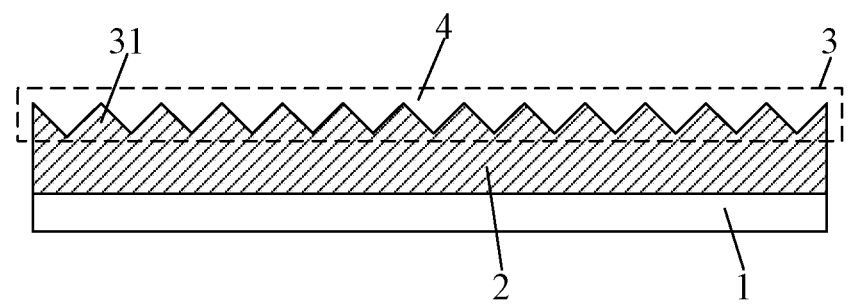
FIG. 1 is a sectional view of the structure of a touch panel according to an embodiment of the present disclosure.

FIG. 1 is a sectional view of the structure of a touch panel according to an embodiment of the present disclosure. As shown in FIG. 1, the touch panel comprises a substrate 1 and a touch electrode 2 arranged on the substrate 1. The touch panel further comprises a light processing structure 3 arranged on a surface of the touch electrode 2 to scatter light irradiated thereon so as to reduce reflection of light by the surface of the touch electrode 2.

By arranging the light processing structure 3, light irradiated on the surface of the touch electrode 2 can be scattered so as to reduce reflection of light by the surface of the touch electrode 2, thereby increasing display brightness of the display panel that uses such touch panel, and reducing the degree of brightness decline when the display panel that uses such touch panel is used outdoors.

In this embodiment, the light processing structure 3 may comprise a plurality of protrusions 31. The plurality of protrusions 31 can be evenly distributed on the surface of the touch electrode 2.

In certain exemplary embodiments, in this embodiment, an interval between any two adjacent protrusions 31 is within the range of 1 nm~1 μm, said interval is a minimum distance between projections of said two adjacent protrusions 31 on the touch electrode 2. By this means, the light processing structure 3 can better scatter light irradiated on the surface of the touch electrode 2 so as to reduce reflection of light by the surface of the touch electrode 2.

In this embodiment, a roughness treatment is performed to the surface of the touch electrode 2, so that a plurality of protrusions 31 are formed on the surface of the touch electrode 2. The protrusions 31 make the surface of the touch electrode 2 rough and scatter the light irradiated on the surface of the touch electrode 2 at the same time, thereby reducing reflection of light irradiated on the surface of the touch electrode 2. The specific principle of arranging protrusions 31 on the surface of the touch electrode 2 so as to reduce reflection of light by the surface of the touch electrode 2 follows the equation of:

$$f(R) = \frac{(1-R)^2}{2R} = \frac{k}{s}. \quad (1)$$

In equation (1), R is a light reflection coefficient of the surface of the touch electrode 2; k is a light absorption coefficient of the surface of the touch electrode 2; s is a light scattering coefficient of the surface of the touch electrode 2; and f(R) is a light reflectivity of the surface of the touch electrode 2. It can be seen from equation (1) that the higher the light scattering coefficient of the surface of the touch electrode 2, the lower the light reflectivity of the surface of the touch electrode 2. The higher the roughness of the surface of the touch electrode 2, the higher the light scattering coefficient of the surface of the touch electrode 2, namely, the light scattering coefficient of the surface of the touch electrode 2 will increase as the roughness of the surface of the touch electrode 2 increases, so the higher the roughness of the surface of the touch electrode 2, the lower the light reflectivity thereof. Hence, by making the surface of the touch electrode 2 become rough, light irradiated thereon can be scattered so as to reduce reflection of light by the surface of the touch electrode 2 and increase display brightness of the display panel that uses said touch panel.

In addition, the material of the light processing structure 3 can be the same as the material of the touch electrode 2. Arranging protrusions 31 on the surface of the touch electrode 2 can not only increase roughness of the surface of the touch electrode 2 but also increase the area of the surface of the touch electrode 2. There is an equation (2): $\Omega=\rho(L/A)$, wherein $\Omega$ is a resistance of the touch electrode 2, $\rho$ is a resistivity, L is a length of the touch electrode 2, and A is an area of the surface of the touch electrode 2. It can be seen that as the area of the surface of the touch electrode 2 increases, the resistance of the touch electrode 2 decreases. Meanwhile, there is also an equation (3): $C=\varepsilon(A/d)$, wherein C is a capacitance of the touch electrode 2, $\varepsilon$ is a dielectric constant, A is the area of the surface of the touch electrode 2, and d is a thickness of the touch electrode 2. It can be seen that as the area of the surface of the touch electrode 2 increases, the capacitance of the touch electrode 2 increases. The resistance of the touch electrode 2 decreases and the capacitance thereof increases, so the touch sensing characteristics of the touch electrode can be improved, thereby improving the electrical characteristics and touch performance of the touch panel.

It shall be noted that the protrusions 31 can also be made of a material different from that of the touch electrode 2. For example, the touch electrode 2 may be made of a metal material, and the protrusions 31 may be made of indium tin oxide, other metal materials or carbon. The protrusions 31 made of these materials can also scatter light irradiated thereon so as to reduce reflection of light by the surface of the touch electrode 2.

In this embodiment, cross-sections of the protrusions 31 perpendicular to the surface of the touch electrode 2 have a shape of a triangle.

It shall be noted that the cross-sections of the protrusions 31 perpendicular to the surface of the touch electrode 2 may have any other shapes like a rectangle, a trapezoid, a semicircle, a half ellipse, or a regular or irregular polygon. The specific shape of the protrusions 31 is not limited as long as it can ensure that the surface of the touch electrode 2 becomes rough and that the light irradiated thereon can be scattered.

In this embodiment, the surface of the touch electrode 2 is a surface of a side 4 of the touch electrode facing away from the substrate. Protrusions 31 are arranged on the surface of the side 4 of the touch electrode facing away from the substrate, which make the surface of the side of the touch electrode facing away from the substrate become rough, so that light irradiated thereon can be scattered to reduce reflection of light by the surface of the side of the touch electrode facing away from the substrate. As a result, the display brightness of the display panel using said touch panel is increased, and the degree of brightness decline is reduced when the display panel that uses said touch panel is used outdoors.

Figure 2:
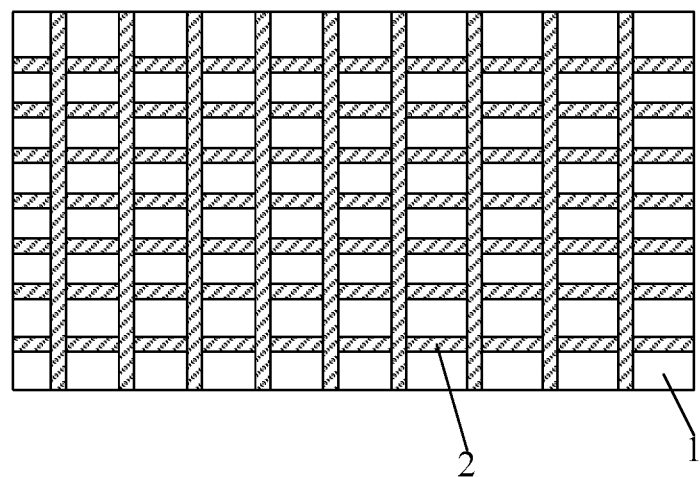
FIG. 2 is a top view of the structure of the touch panel according to an embodiment of the present disclosure.

In this embodiment, as shown in FIG. 2, the touch electrodes 2 are distributed in a grid shape; and the material of the touch electrodes 2 may include a metal material. Of course, the touch electrodes 2 can also be distributed in other shapes, and the material of the touch electrodes 2 can also be a transparent conductive material, such as an indium tin oxide material, etc.

Based on the above structure of the touch panel, the present embodiment further provides a manufacturing method for said touch panel, which comprises forming the touch electrode 2 on the substrate 1; forming the light processing structure 3 on the surface of the touch electrode 2, which can scatter light irradiated thereon so as to reduce reflection of light by the surface of the touch electrode 2.

In this embodiment, forming the light processing structure 3 on the surface of the touch electrode 2 comprises: forming the touch electrode 2 by a patterning process, and etching the surface of the touch electrode 2 during etching in the patterning process so as to form the light processing structure 3 on the surface of the touch electrode 2. That is, the touch electrode 2 is formed by the patterning process (including steps of film layer deposition, exposure, development, etching, etc.), and the surface of the touch electrode 2 is directly etched during the etching process so as to form the protrusions 31 on the surface of the touch electrode 2.

It shall be noted that the light processing structure 3 can also be formed on the surface of the touch electrode 2 by the following method: forming a film layer having the light processing structure 3 through a printing method first, then stamping the film layer having the light processing structure 3 on the surface of the touch electrode 2. That is, first a thin film having the protrusions 31 is formed by the printing method and using the material for forming the touch electrode 2, then the thin film is stamped on the surface of the touch electrode 2 to make the surface of the touch electrode 2 rough.

Figure 3:
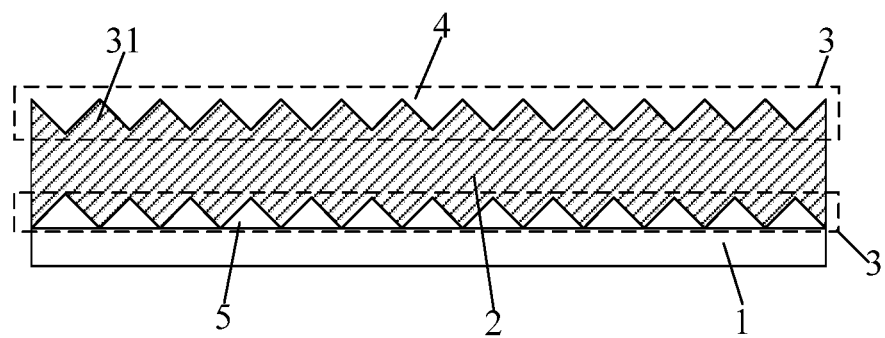
FIG. 3 is a sectional view of the structure of a touch panel according to another embodiment of the present disclosure.

According to another embodiment of the present disclosure, a touch panel is provided. Unlike in the above embodiments, the surface of the touch electrode 2 is a surface of a side 4 of the touch electrode facing away from the substrate and a surface of a side 5 close to the substrate, as shown in FIG. 3. Namely, the light processing structure 3 (i.e. the plurality of protrusions 31) is arranged on both the surface of the side 4 of the touch electrode facing away from the substrate and the surface of the side 5 close to the substrate. The surface of the side of the touch electrode close to the substrate is actually opposite to the surface of the side of the touch electrode facing away from the substrate.

Protrusions 31 arranged on the surface of the side 5 of the touch electrode close to the substrate can make said surface rough, so that light irradiated on said surface of the side 5 of the touch electrode close to the substrate can be scattered and reflection of light by said surface of the touch electrode can be reduced, thereby increasing display brightness of the display panel that uses said touch panel, and reducing the degree of brightness decline when the display panel that uses said touch panel is used outdoors.

Other structures of the touch panel as well as the manufacturing method of the touch panel in this embodiment are the same as those described in the above embodiments, so they will not elaborated herein any more.

All embodiments described above have advantageous effects, i.e. by providing the light processing structure, the touch panel provided can scatter light irradiated on the surface of the touch electrode so as to reduce reflection of light by the surface of the touch electrode, thereby increasing display brightness of the display panel that uses said touch panel, and reducing the degree of brightness decline when the display panel that uses said touch panel is used outdoors.

According to still another embodiment of the present disclosure, a display panel is provided, which comprises the touch panel provided in any one of the above-described embodiments.

Said display panel is an organic electroluminescent panel or a liquid crystal panel.

By using the touch panel provided in any one of the above-described embodiments, display brightness of the display panel is increased, especially the display brightness of the display panel when being used outdoors is increased, thus the display effect of the display panel is improved.

According to yet another embodiment of the present disclosure, a display device is provided, which comprises the above-described display panel. By using said display panel, the display effect of the display device is improved.

The display device provided in the present disclosure can be any product or component having a display function, such as an OLED panel, an OLED television, a liquid crystal panel, a liquid crystal television, a monitor, a mobile phone, a navigator, etc.

It shall be understood that the above embodiments are merely exemplary embodiments presented for illustrating the principle of the present disclosure, but the present disclosure is not limited to these embodiments. Those ordinarily skilled in the art can make various changes and improvements without departing from the spirit and substance of the present disclosure, so these changes and improvements shall also be considered to be within the protection scope of the present disclosure.

The invention claimed is:

1. A touch panel, comprising: a substrate; a touch electrode arranged on the substrate; and a light processing structure arranged on a surface of the touch electrode to scatter light irradiated to reduce reflection of light by the surface of the touch electrode, wherein the surface of the touch electrode faces the substrate, a cross section view of the touch electrode has a sawtooth shape, the touch electrode and the light processing structure are integrated, a material used for the touch electrode comprises metal material, and a material for the light processing structure is the same as the material used for the touch electrode.

2. The touch panel according to claim 1, wherein the light processing structure comprises a plurality of protrusions.

3. The touch panel according to claim 2, wherein the plurality of protrusions are evenly distributed on the surface of the touch electrode.

4. The touch panel according to claim 2, wherein an interval between any two adjacent ones of the protrusions is within the range of 1 nm-1 μm.

5. The touch panel according to claim 2, wherein the material of which the protrusions are made comprises at least one of indium tin oxide, metal material and carbon.

6. The touch panel according to claim 1, wherein the touch electrode is distributed in a grid shape.

7. A display panel, comprising the touch panel according to claim 1.

8. The display panel according to claim 7, wherein the display panel is selected from a group consisting of an organic electroluminescent panel and a liquid crystal panel.

9. A display device, comprising the display panel according to claim 7.

10. The display panel according to claim 7, wherein the light processing structure comprises a plurality of protrusions.

11. The display panel according to claim 10, wherein the plurality of protrusions are evenly distributed on the surface of the touch electrode.

12. The display panel according to claim 10, wherein an interval between any two adjacent ones of the protrusions is within the range of 1 nm-1 μm.

* * * * *